United States Patent [19]
Ko

[11] Patent Number: 5,854,135
[45] Date of Patent: Dec. 29, 1998

[54] OPTIMIZED DRY ETCHING PROCEDURE, USING AN OXYGEN CONTAINING AMBIENT, FOR SMALL DIAMETER CONTACT HOLES

[75] Inventor: Jun-Cheng Ko, Taichung, Taiwan

[73] Assignee: Vanguard International Semiconductor Corporation, Hsin-Chu, Taiwan

[21] Appl. No.: 835,579

[22] Filed: Apr. 9, 1997

[51] Int. Cl.[6] .................... H01L 21/302; H01L 21/461
[52] U.S. Cl. .................. 438/712; 438/723; 438/301; 438/305; 438/307; 438/16
[58] Field of Search .................. 438/16, 301, 305, 438/307, 682, 712, 723

[56] References Cited

U.S. PATENT DOCUMENTS

| | | | |
|---|---|---|---|
| 4,356,055 | 10/1982 | Montier | 156/626 |
| 5,393,704 | 2/1995 | Huang et al. | 438/305 |
| 5,425,839 | 6/1995 | Henck | 156/626.1 |
| 5,480,814 | 1/1996 | Wuu et al. | 438/305 |
| 5,503,901 | 4/1996 | Sakai et al. | 428/161 |
| 5,547,900 | 8/1996 | Lin | 438/305 |
| 5,554,557 | 9/1996 | Koh | 437/52 |
| 5,571,366 | 11/1996 | Ishii et al. | 156/345 |
| 5,620,556 | 4/1997 | Henck | 438/8 |
| 5,650,339 | 7/1997 | Saito et al. | 437/21 |
| 5,654,233 | 8/1997 | Yu | 438/643 |
| 5,656,128 | 8/1997 | Hashimoto et al. | 216/47 |
| 5,677,238 | 10/1997 | Gn et al. | 437/194 |
| 5,707,486 | 7/1990 | Collins | 156/643.1 |

*Primary Examiner*—John Niebling
*Assistant Examiner*—David A. Zarneke
*Attorney, Agent, or Firm*—George O. Saile; Stephen B. Ackerman

[57] ABSTRACT

An anisotropic RIE procedure for creating a small diameter SAC opening, in an insulator layer, used in the fabrication sequence of a MOSFET device, and using a large area test site for RIE end point monitoring, has been developed. The RIE procedure features a RIE ambient, including oxygen as part of the RIE ambient, resulting in equal amounts of polymer deposition on the small diameter SAC opening, as well as on the large area test sites, during the reactive ion etching of the small diameter, SAC opening. This allows accurate monitoring of the RIE procedure to be performed on the large area test site, using optical ellipsometry procedures.

10 Claims, 6 Drawing Sheets

OPTIMIZED DRY ETCHING PROCEDURE, USING AN OXYGEN CONTAINING AMBIENT, FOR SMALL DIAMETER CONTACT HOLES

BACKGROUND OF THE INVENTION

(1) Field of the Invention

The present invention relates to the fabrication of semiconductor devices, and more specifically to a procedure used to create a small diameter opening in an insulator layer.

(2) Description of Prior Art

The semiconductor industry is continually striving to improve the performance of semiconductor devices while still attempting to maintain, or even to decrease, the cost of semiconductor devices. These objectives have been successfully addressed by the ability of the industry to fabricate devices with sub-micron dimensions, or microminiaturization. Sub-micron features allow smaller semiconductor chips to be realized, possessing increased device packing densities as counterparts fabricated with larger features, however still possessing the same level of logic or memory function, contained with the larger semiconductor chips. Therefore a greater number of the smaller semiconductor chips can now obtained from a specific size starting substrate, therefore reducing the processing cost of a specific chip. In addition the smaller features obtained using microminiaturization results in performance enhancements, realized via decreases in performance degrading resistances and capacitances.

The ability to create sub-micron features for semiconductor devices can be largely attributed to advances in semiconductor fabrication disciplines such as photolithography and dry etching. The use of more sophisticated exposure cameras, as well as the development of more sensitive photoresist materials, have enabled sub-micron images in photoresist layers to be routinely achieved. In addition the use of more advanced dry etching tools and procedures have enabled the sub-micron feature, in masking photoresist layers, to be successfully transferred to underlying materials, used in the fabrication of semiconductor devices. However in addition to advances in fabrication disciplines, specific processing procedures, such as the use of a self-aligned contact, (SAC), structure, have allowed semiconductor devices, with sub-micron features, to be easily created, and used for the fabrication of dynamic random access memory, (DRAM), or static random access memory, (SRAM), devices. The SAC concept consists of placing a metal silicide—polysilicon, (polycide), structure, in a SAC opening, with the SAC opening, previously formed in an insulator layer.

The SAC concept allows an easier photolithographic procedure to be used to expose a source and drain region. For example, using a conventional process, or a process not using the SAC concept, in order to insure alignment to the underlying source and drain region, during the photolithographic procedure, additional area has to be made available, to insure that the entire opening of the contact hole resides over the source and drain region. This results in an increase in the cell size of the specific device being fabricated, thus reducing DRAM or SRAM density. However with the use of the SAC procedure, a source and drain region is exposed, however the opening to this region is enlarged to overlie portions of adjacent insulator coated, polysilicon gate structures, with the source and drain region residing between polysilicon gate structures. Therefore the area needed for contact is defined by the space between polysilicon gate structures, and not dependent on photolithographic alignment procedures.

The use of the SAC procedure, to remove insulator material from between polysilicon gate structures, to expose an underlying source and drain region of a DRAM or SRAM device, can entail insulator removal from an opening with diameters in the range of 0.35 uM, or smaller. The insulator removal procedure, creating the SAC opening, is performed using reactive ion etching, (RIE), procedures. The progress of the RIE procedure is usually determined by measuring the insulator remaining on a specific area of the semiconductor substrate, using optical ellipsometry. A specific test site, located on non-device regions of the semiconductor substrate, much larger in area than the SAC dimension, is comprised of the identical insulator being removed from the SAC region, and is used as the target for the optical ellipsometric measurements. However during the RIE procedure a polymer forms, and deposits on the insulator surface being dry etched, with thicker polymer depositing on the larger test site regions then on the smaller SAC regions. Since the RIE removal of insulator consists of a combination of polymer and insulator removal, end point detection, or the absence of insulator, will not be observed on the larger test site region, even after the smaller SAC region has been cleared of insulator, due to the thicker polymer deposits on the larger test site regions. Additional RIE processing, used to clear the test site area, will result in an overetch in the SAC region. Without good etch selectivity of the RIE ambient, the overetch of the SAC region can result in gouging or trenching of the source and drain region, resulting in resistance increases, and thus performance degradation.

This invention will teach a process for RIE removal of insulator, in which the removal rate of insulator is independent of area of exposed insulator. The invention features the use of a specific RIE ambient chemistry, resulting in equalizing the amounts of polymer deposition during the RIE procedure, independent of exposed insulator area, thus enabling optical ellipsometry procedures to be reliably used for SAC openings. Other inventions addressing SAC procedures, such as Koh, in U.S. Pat. No. 5,554,557, do not address the RIE chemistry needed for successful monitoring of the SAC opening procedure, using optical ellipsometry measurements.

SUMMARY OF THE INVENTION

It is an object of this invention to fabricate metal oxide semiconductor field effect transistors, (MOSFET), on a semiconductor substrate, using a self aligned contact, (SAC), structure, allowing polysilicon to contact an underlying source and drain region.

It is another object of this invention to form a SAC opening, with a sub-micron diameter, in an insulator layer, exposing an underlying source and drain region, using a RIE procedure, featuring the addition of oxygen to the RIE ambient.

It is still another object of this invention to use a test site, larger in area then the sub-micron diameter, SAC opening, to monitor the progress of the RIE procedure, using optical ellipsometry procedures.

In accordance with the present invention a process is described for fabricating a MOSFET device, on a semiconductor substrate, using a SAC structure, featuring the RIE of insulator material, exposed in a sub-micron photoresist opening, using oxygen as part of the RIE ambient, to equalize polymer deposition on small and large exposed insulator regions. After formation of polycide gate structures, on thin gate oxides, and with the polycide gate structure capped with an insulator layer, lightly doped source and drain regions are formed, in areas not covered by the insulator capped, polycide gate structures. After formation of insulator spacers, on the sides of the polycide gate structures, heavily doped source and drain regions are formed in the space between polycide gate structures. A insulator layer is deposited and patterned, using an oxygen containing RIE ambient, to create a sub-micron diameter SAC opening in the insulator layer. Optical ellipsometry monitoring of the progress of the RIE procedure, is performed on large area test sites, during the SAC opening, RIE procedure. Subsequent depositions of an underlying polysilicon layer, and an overlying metal silicide layer, are followed by patterning of the metal silicide and polysilicon layers to create a polycide SAC structure, in the sub-micron diameter SAC opening, partially overlying the insulator capped, polycide gate structures. The SAC structure can be used for the bit contact of DRAM devices.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating MOSFET devices, featuring a SAC structure, and with the SAC opening formed via a RIE procedure, using an oxygen containing RIE ambient, will now be described in detail. These MOSFET devices, with the SAC structure, can be used for the creation of SRAM or DRAM cells. For this application the MOSFETs will be comprised of n-channel, MOSFET devices, however this invention can also be applied to p-channel, MOSFET devices.

This invention will now describe the fabrication of MOSFET devices, in region 30, as well as a large area test site, in region 40, to be used as a site for optical ellipsometry measurements for a subsequent RIE procedure, used to form a SAC opening. A P type, single crystalline, silicon substrate, 1, with a <100> crystallographic orientation, is used, and shown schematically in FIG. 1. Field oxide, (FOX), regions, 2, formed for isolation purposes, are thermally grown to a thickness between about 3000 to 5000 Angstroms, using thermal oxidation procedures. Subsequent device regions are protected from the FOX oxidation procedure by oxidation resistant masking patterns, comprised of a silicon nitride—silicon oxide composite masking layer. After removal of the composite, oxidation resistant mask, a thin gate, silicon dioxide layer, 3, is thermally grown, in an oxygen steam ambient, at a temperature between about 800° to 1000° C., to a thickness between about 50 to 250 Angstroms. Next a first layer of in situ doped polysilicon, 4, is deposited using low pressure chemical vapor deposition, (LPCVD), procedures, at a temperature between about 500° to 700° C., to a thickness between about 500 to 2000 Angstroms, using silane as a source, and with the addition of phosphine to provide the needed dopant. A first layer of tungsten silicide, 5, is then deposited, using LPCVD procedures, at a temperature between about 400° to 600° C., to a thickness between about 750 to 2000 Angstroms, using tungsten hexafluoride and silane as a source. Finally a first silicon oxide layer, 6, is deposited using either LPCVD or plasma enhanced chemical vapor deposition, (PECVD), procedures, at a temperature between about 350° to 750° C., to a thickness between about 1000 to 3000 Angstroms, using tetraethylorthosilicate, (TEOS), as a source.

Figure 1:
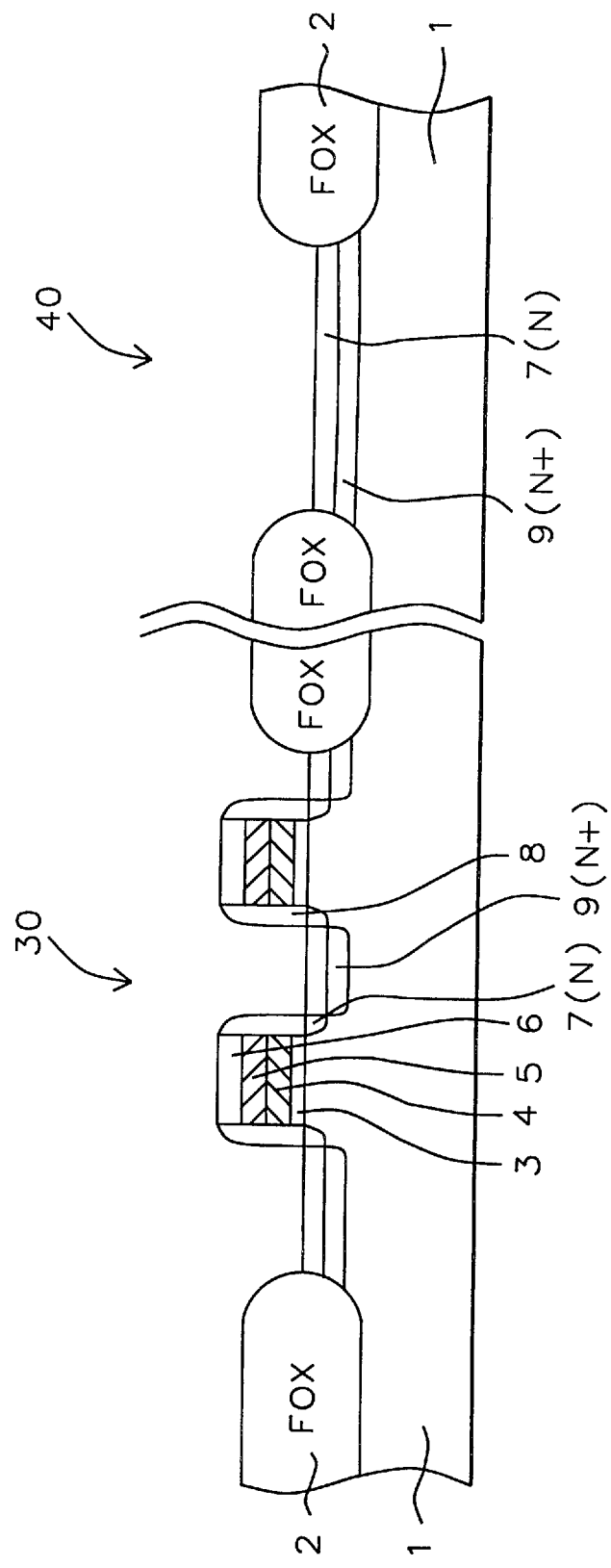
FIGS. 1–2, which schematically, in cross-sectional style, show MOSFET devices, as well as RIE end point test sites, prior to the formation of a SAC opening, in an insulator layer.

Conventional photolithographic and reactive ion etching, (RIE), procedures, using $CHF_3$ as an etchant for first silicon oxide layer, 6, and $Cl_2$ as an etchant for both first tungsten silicide layer, 5, and first polysilicon layer, 4, are used to produce the silicon oxide capped, polycide gate, (first tungsten silicide—first polysilicon), structures, shown schematically for MOSFET device region, 30, in FIG. 1. Test site region, 40, not protected by photoresist, experienced the complete removal of silicon oxide layer, 6, first tungsten silicide layer, 5, and first polysilicon layer, 4. After photoresist removal via plasma oxygen ashing and careful wet cleans, a lightly doped source and drain region, 7, is next created via ion implantation of phosphorous or arsenic, at an energy between about 25 to 75 KeV, at a dose between about 5E11 to 5E13 atoms/$cm^2$. A second silicon oxide layer is deposited, again via use of either LPCVD or PECVD procedures, at a temperature between about 350° to 750° C., to a thickness between about 1500 to 4000 Angstroms, using TEOS as a source, followed, by an anisotropic RIE procedure, using $CHF_3$ as an etchant, to create insulator spacers, 8, schematically shown for MOSFET device region, 30, in FIG. 1. Again test site region, 40, received the deposition of second insulator layer, but had this layer, as well as silicon dioxide layer, 3, completely removed during the sidewall RIE procedure. The space between polycide gate spacers, to be used as part of the surface area for contact the subsequent SAC structure is between about 0.3 by 0.5 uM. Heavily doped source and drain regions, 9, are then produced via ion implantation of either arsenic or phosphorous, at an energy between about 30 to 100 KeV, at a dose between about 1E14 to 1E16 atoms/$cm^2$. This region is also shown schematically in FIG. 1.

Figure 2:
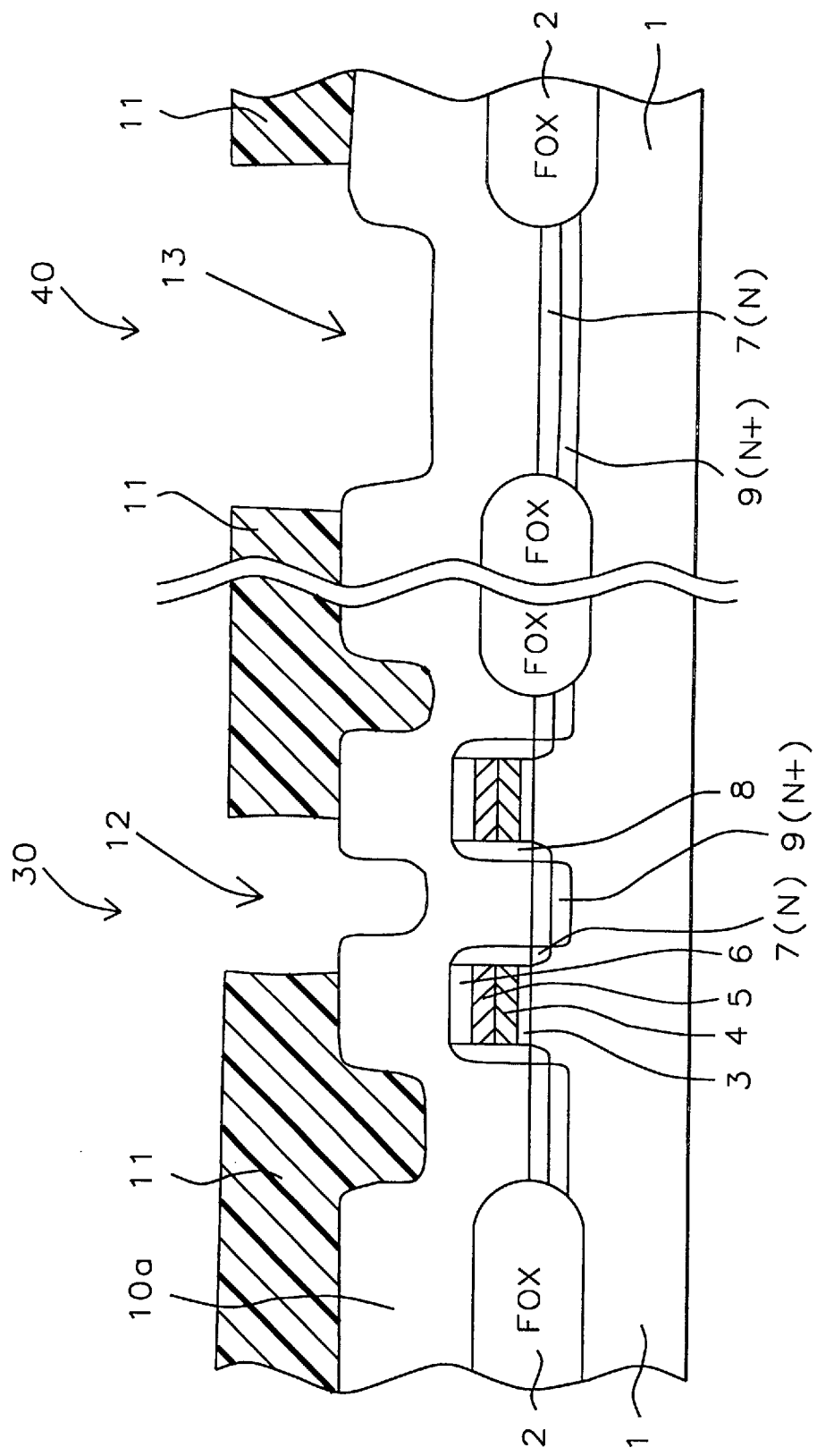

A third layer of silicon oxide, 10a, is deposited, again using either LPCVD or PECVD procedures, at a temperature between about 350° to 750° C., to a thickness between about 3000 to 5000 Angstroms, using TEOS as a source. A photoresist shape, 11, is formed, exposing an area, 12, where a self-aligned contact, (SAC), opening, will be subsequently formed. Opening, 12, has a dimension of about 0.4 by 0.6 uM, in the MOSFET device region, 30. Photoresist shape, 11, also exposes an area, 13, with a diameter between about 40 to 50 uM, in test site region, 40, to be used for RIE end point detection. This is shown schematically in FIG. 2.

Figure 3:
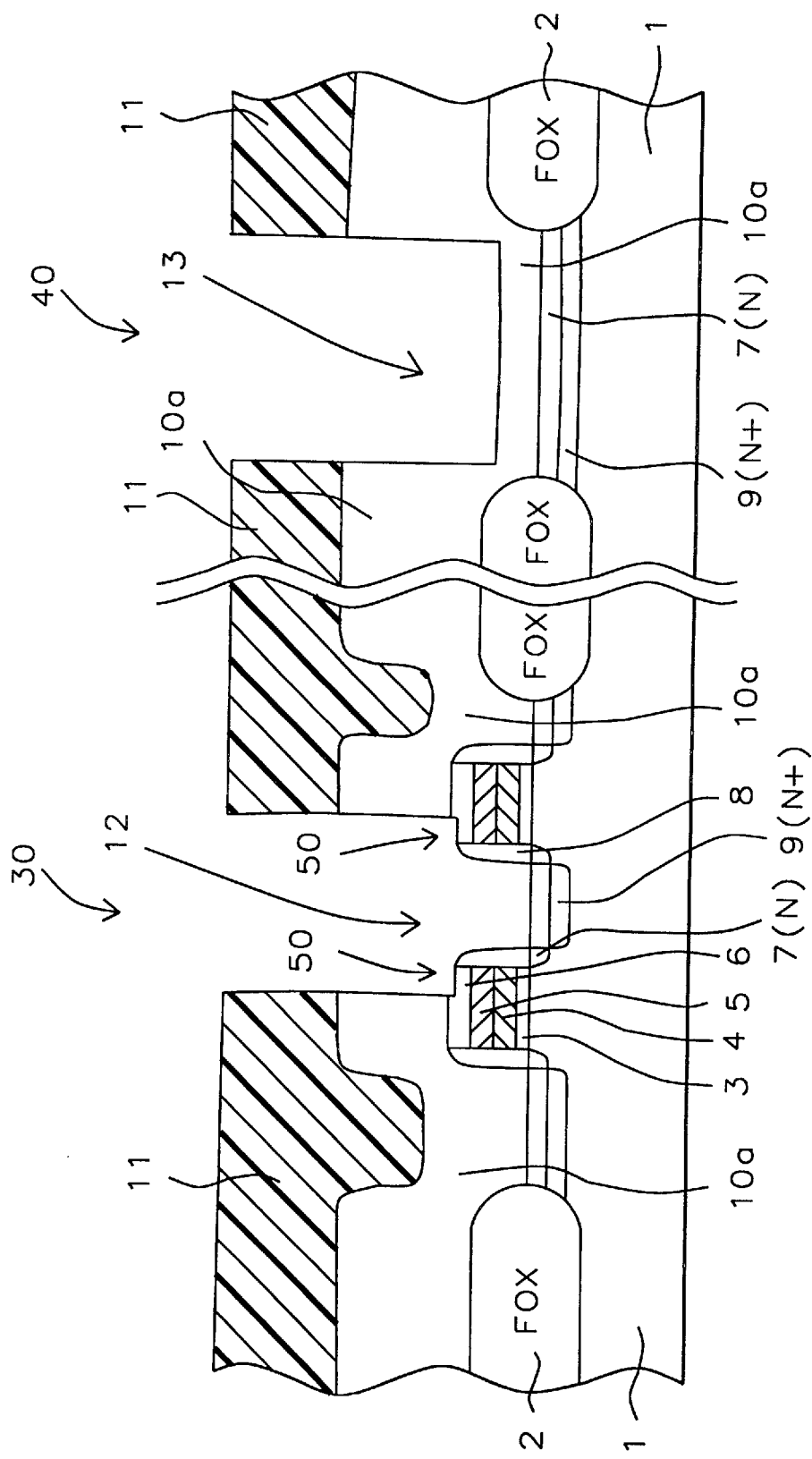
FIGS. 3–4, which schematically, in cross-sectional style, show prior art in which the SAC opening was created using a non-oxygen containing RIE ambient, and using a large area test site for optical ellipsometry end point detection.
Figure 4:
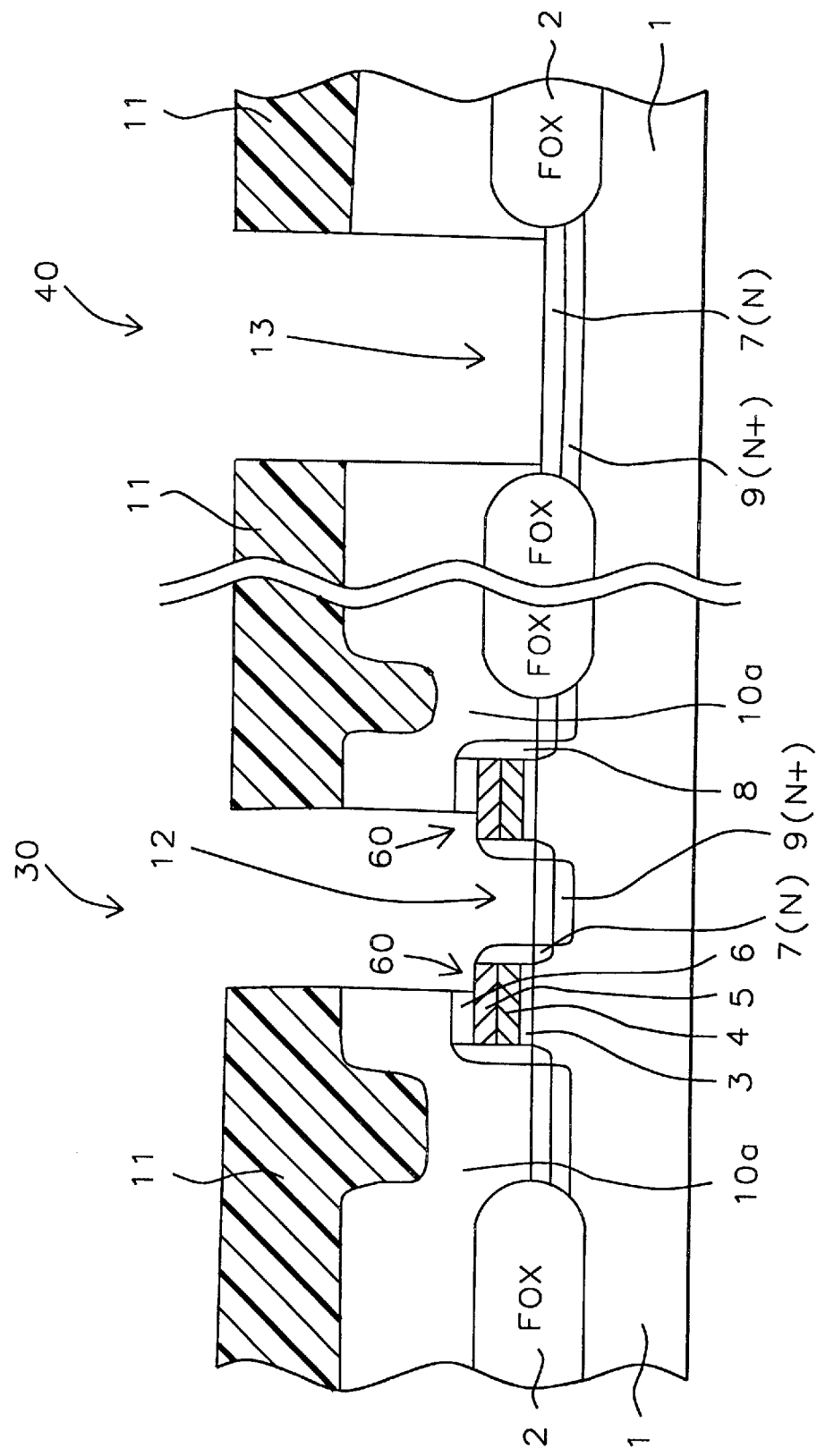

FIGS. 3–4, schematically show the effect of using a large area, 13, in test site region, 40, for RIE endpoint detection, of a RIE process, using a non-oxygen containing RIE ambient, used to open a small diameter, SAC opening, 12, in MOSFET region, 30. During the RIE procedure using $C_4F_8$—CO—Ar, a polymer, comprised of carbon and fluorine, forms and deposits on the surface of silicon oxide layer, 10a. The RIE procedure therefore consists of removal of the depositing CF polymer, while also removing silicon oxide layer, 10a. However the CF polymer forms, and deposits more heavily on the large area regions, 13, of test site region, 40, then on the small diameter SAC opening, 12, in MOSFET device region, 30. Therefore during the RIE procedure, small diameter, SAC opening, 12, will be cleared of silicon oxide layer, 10a, prior to the complete removal of silicon oxide layer, 10a, in large area opening, 13, of test region, 40. FIG. 3, schematically illustrates a stage in the RIE procedure in which small diameter, SAC opening, 12, has been cleared of silicon oxide layer, 10a, while the large area opening, 13, in test site region, 40, still indicates between about 1000 to 3000 Angstroms of silicon oxide layer, 10a, remaining. This occurred due to the heavier deposits of polymer on large area opening, 13, compared to the lighter polymer deposits on small diameter opening, 12. Since end point detection is experienced using large area opening, 13, one would believe that small diameter, SAC opening, 12, still has silicon oxide layer, 10a, remaining, and thus continuation the RIE procedure would progress until end point for large area opening, 13, was determined.

FIG. 4. shows the consequence of continuing the RIE procedure to a point in which end point is achieved, or complete removal of silicon oxide layer, 10a, was achieved in large area opening, 13, in test site region, 40. In MOSFET region, 30, the inside corners of first silicon oxide layer, 6, are exposed to the RIE procedure, resulting in the removal of first silicon oxide layer, 6, creating exposed tungsten silicide surface, 50. Subsequent deposition and formation of a polycide, SAC structure, will result in shorting between the polycide, SAC structure, and the polycide gate structures. In addition if a non-selective RIE chemistry is used, the exposure of the heavily doped source and drain region, 9, to the continuation of etching in small diameter SAC opening, 12, could result in partial or complete removal of heavily doped source and drain region, 9, resulting in high MOSFET resistance, thus adversely influencing device performance.

Figure 5:
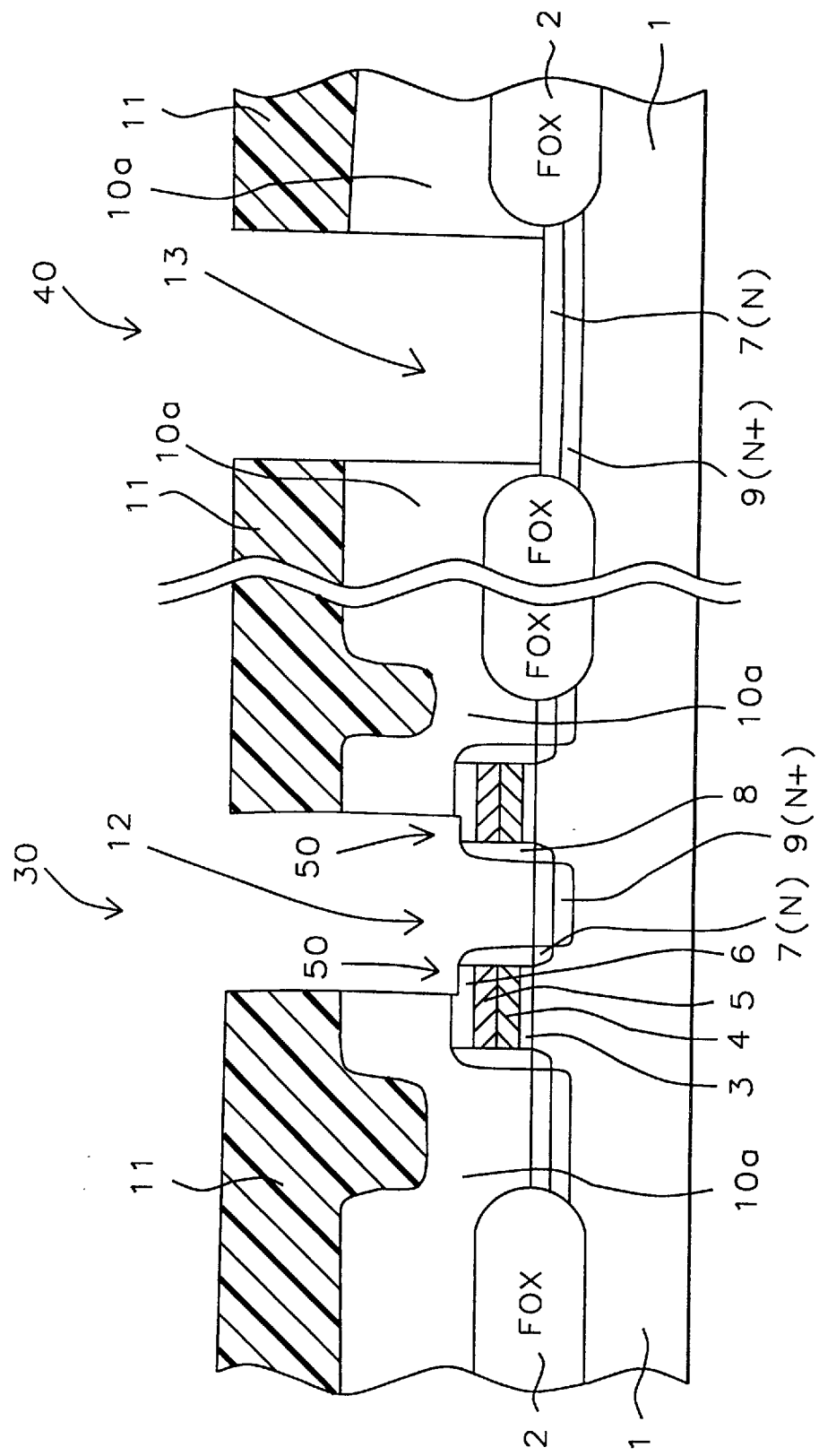
FIGS. 5–6, which schematically, in cross-sectional style, show the creation of the SAC structure, in which the SAC opening was formed in an oxygen containing RIE ambient, using a large area test site for optical ellipsometry end point detection.
Figure 6:
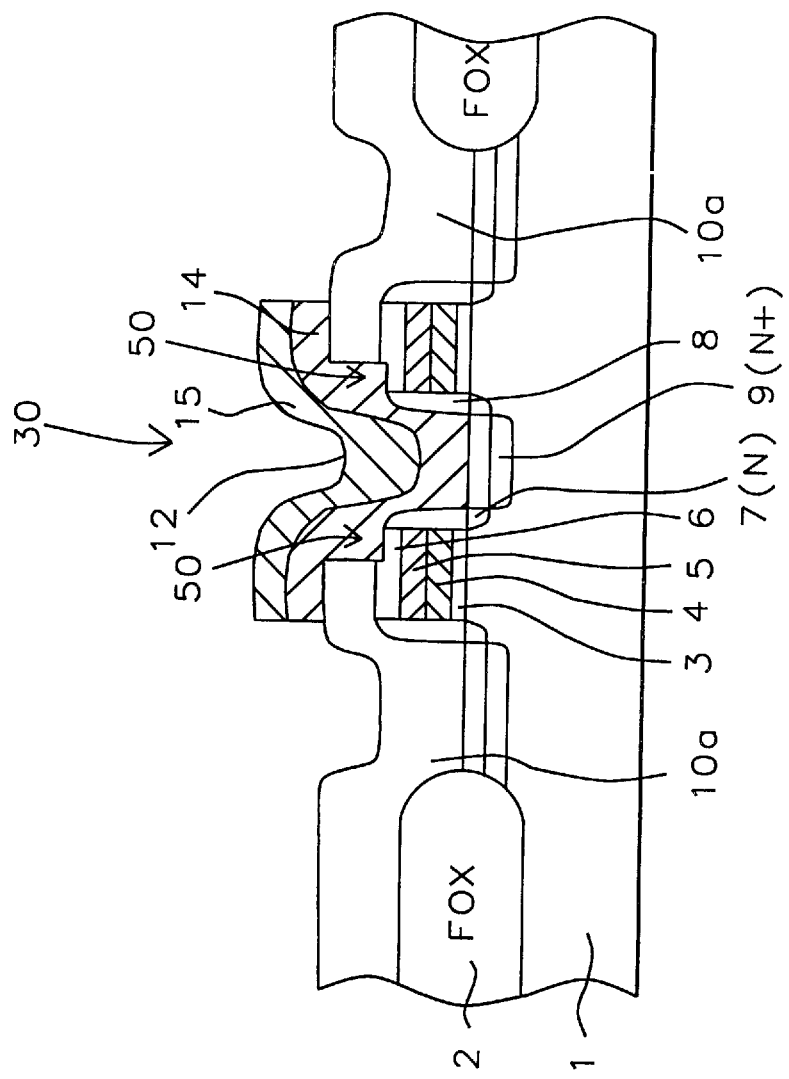

A RIE procedure, featuring equal amounts of insulator removal, independent of the width of exposed insulator layer, is now described in FIGS. 5–6. Referring again to MOSFET region, 30, the small diameter, SAC opening, 12, defined in photoresist layer, 11, is subjected to a RIE procedure, used to remove insulator layer, 10a, and form the SAC opening for MOSFET device region, 30. Large area opening, 13, in test site region, 40, is again used for optical ellipsometry end point detection. However in this case, between about 1 to 20 sccm of oxygen has been added to a RIE ambient comprised of $C_4F_8$—CO—Ar. The addition of oxygen to the RIE ambient decreases the amount of polymer deposition in large area opening, 13, of test site region, 40, to a level now equal to the level of polymer formed in the small diameter, SAC opening, 12, of MOSFET device region, 30. The equal amounts of polymer, in both openings, result in equal removal rates for insulator layer, 10a. This in turn results in reliable end point detection, using large area opening, 13. FIG. 5, shows the result of the RIE procedure, using an oxygen containing ambient. When end point was reached for large area opening, 13, small diameter, SAC opening, 12, had also just formed, without overetching of the exposed corners of first silicon oxide layer, 6, and thus not exposing tungsten silicide layer, 5, as was the case with the use of non-oxygen containing RIE ambients.

FIG. 6, shows the conclusion of the SAC structure fabrication sequence. After removal of photoresist layer, 11, via plasma oxygen ashing and careful wet cleans, a second layer of polysilicon, 14, is deposited using LPCVD procedures, at a temperature between about 500° to 700° C., to a thickness between about 450 to 650 Angstroms, including the addition of phosphine or arsine to a silane ambient, for purposes of in situ doping. A second layer of tungsten silicide, 15, is next deposited using LPCVD procedures, at a temperature between about 400° to 600° C., to a thickness between about 750 to 2000 Angstroms, using tungsten hexafluoride and silane as a source. Patterning to create a polycide, SAC contact structure in next addressed via photolithographic and RIE procedures, using $Cl_2$ as an etchant for both second tungsten silicide layer, 15, as well as second polysilicon layer, 14. Photoresist removal is again accomplished via plasma oxygen ashing and wet clean procedures.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using a small diameter SAC opening in an insulator layer, in a first region of said semiconductor substrate, to expose a source and drain region of said MOSFET device, with said small diameter SAC opening created via a RIE procedure, using oxygen as part of the RIE ambient, and monitoring the RIE end point of said small diameter SAC opening, using optical ellipsometry procedures, performed on a large area test site, in a second region of said semiconductor substrate, comprising the steps of:

forming field oxide regions in said semiconductor substrate;

growing a gate insulator layer on said semiconductor substrate;

depositing an in situ doped, first polysilicon layer, on said gate insulator layer;

depositing a first tungsten silicide layer, on said first polysilicon layer;

depositing a first silicon oxide layer on said first tungsten silicide layer;

patterning of said first silicon oxide layer, of said first tungsten silicide layer, and of said first polysilicon layer, to from polycide gate structures on underlying, said gate insulator layer in said first region of said semiconductor substrate;

ion implanting a first conductivity imparting dopant into said first region of said semiconductor substrate, not covered by said polycide gate structures, to form a lightly doped source and drain region;

depositing a second silicon oxide layer;

anisotropic etching of said second silicon oxide layer to form silicon oxide spacers on the sides of said polycide gate structures;

ion implanting a second conductivity imparting dopant into said first region of said semiconductor substrate, not covered by said polycide gate structures, and not covered by said silicon oxide spacers, to form said heavily doped source and drain region in region between said polycide gate structures;

depositing a third silicon oxide layer;

forming a photoresist shape on said third silicon oxide layer, comprised of a first opening, with a diameter between about 0.4 to 0.6 uM, exposing a region of said third silicon oxide layer, residing in said first region of said semiconductor substrate, and comprised of a second opening, with a diameter between about 40 to 50 uM, exposing a region of said third silicon oxide layer, residing in said second region of said semiconductor substrate:

performing an initial phase of a reactive ion etching procedure, using $C_4F_8$—CO—Ar, with the addition of between about 1 to 20 sccm of oxygen, resulting in a first polymer layer, comprised of carbon and fluorine, deposited on said third silicon oxide layer, exposed in said first opening, in said photoresist shape, and depositing a second polymer layer, comprised of carbon and fluorine, on said third silicon oxide layer, exposed in said second opening, in said photoresist shape, with the thickness of said second polymer layer, equal to the thickness of said first polymer layer;

performing a final phase of said reactive ion procedure, using $C_4F_8$—CO—Ar, with the addition of between about 1 to 20 sccm of oxygen, to simultaneously remove said first polymer layer, and said third silicon oxide layer, exposed in said first opening, in said photoresist shape, creating said small diameter SAC opening, between about 0.4 to 0.6 uM in diameter, in said first region of said semiconductor substrate, exposing said heavily doped source and drain region, and removing said second polymer layer, and said third silicon oxide layer, exposed in said second opening in said photoresist shape, creating a large opening between about 40 to 50 uM in diameter, in said second region of said semiconductor substrate, used for ellipsometric measurements to determine said RIE endpoint;

removal of said photoresist shape;

depositing a second polysilicon layer, including deposition on said heavily doped source and drain region, exposed in said small diameter SAC opening;

deposition of a second tungsten silicide layer on said second polysilicon layer; and patterning of said second tungsten silicide layer, and of said second polysilicon layer, to create a polycide, self-aligned contact, (SAC), structure, completely overlying said small diameter SAC opening, and with said polycide SAC structure partially overlying a portion of said polysilicon gate structures, in regions where said polycide gate structures are adjacent to said small diameter, SAC opening.

2. The method of claim 1, wherein said first polysilicon layer, of said polycide gate structure, is deposited using LPCVD processing, at a temperature between about 500° to 700° C., to a thickness between about 500 to 1500 Angstroms, using silane as a source, and using phosphine to provide in situ doping.

3. The method of claim 1, wherein said first tungsten silicide layer, of said polycide gate structure, is deposited using LPCVD procedures, at a temperature between about 400° to 600° C., to a thickness between about 750 to 2000 Angstroms, using tungsten hexafluoride and silane as a source.

4. The method of claim 1, wherein said polycide gate structure is formed via anisotropic RIE procedures, using $CHF_3$ as an etchant for said first silicon oxide layer, and using $Cl_2$ as an etchant for said first tungsten silicide layer, and for said first polysilicon layer.

5. The method of claim 1, wherein said silicon oxide spacers, on the sides of said polycide gate structures, are formed by deposition of a second silicon oxide layer, using PECVD or LPCVD procedures, at a temperature between about 300° to 700° C., to a thickness between about 1500 to 4000 angstroms, using TEOS as a source, followed by an anisotropic RIE procedure, using $CHF_3$ as an etchant.

6. The method of claim 1, wherein the space between said polycide gate structures, including said silicon oxide spacers, is between about 0.3 to 0.5 uM.

7. The method of claim 1, wherein said second conductivity imparting dopant, used to create said heavily doped regions, in the space between said polycide gate structures, is arsenic or phosphorous, ion implanted at an energy between about 30 to 100 KeV, at a dose between about 1E14 to 1E16 atoms/cm$^2$.

8. The method of claim 1, wherein said second polysilicon layer, of said polycide SAC structure, is deposited using LPCVD procedures, at a temperature between about 500° to 700° C., to a thickness between about 450 to 650 Angstroms, using silane as a source, and using phosphine to provide the in situ doping.

9. The method of claim 1, wherein said second tungsten silicide layer, of said polycide SAC structure, is deposited using LPCVD procedures, at a temperature between about 400° to 600° C., to a thickness between about 750 to 2000 Angstroms, using tungsten hexafluoride and silane as a source.

10. The method of claim 1, wherein said polycide SAC structure is formed via anisotropic RIE procedures, using $Cl_2$ as an etchant for said second tungsten silicide layer, and for said second polysilicon layer.

* * * * *